United States Patent
Cho et al.

(10) Patent No.: US 11,895,817 B2
(45) Date of Patent: Feb. 6, 2024

(54) SRAM DEVICE INCLUDING OXIDE SEMICONDUCTOR

(71) Applicant: Electronics and Telecommunications Research Institute, Daejeon (KR)

(72) Inventors: Sung Haeng Cho, Daejeon (KR); Byung-Do Yang, Daejeon (KR); Sooji Nam, Daejeon (KR); Jaehyun Moon, Daejeon (KR); Jae-Eun Pi, Daejeon (KR); Jae-Min Kim, Cheongju-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 17/529,817

(22) Filed: Nov. 18, 2021

(65) Prior Publication Data
US 2023/0102625 A1 Mar. 30, 2023

(30) Foreign Application Priority Data
Sep. 24, 2021 (KR) .......................... 10-2021-0126685

(51) Int. Cl.
*H10B 10/00* (2023.01)
*G11C 11/417* (2006.01)
*G11C 11/412* (2006.01)

(52) U.S. Cl.
CPC ............ *H10B 10/12* (2023.02); *G11C 11/412* (2013.01); *G11C 11/417* (2013.01)

(58) Field of Classification Search
CPC ........ H10B 10/12; H10B 10/00; G11C 11/41; G11C 11/417; G11C 11/412
See application file for complete search history.

(56) References Cited

U.S. PATENT DOCUMENTS

| 4,774,205 A | 9/1988 | Choi et al. |
| 6,271,542 B1 | 8/2001 | Emma et al. |

(Continued)

FOREIGN PATENT DOCUMENTS

| KR | 1999-0062569 A | 7/1999 |
| KR | 10-2013-0097675 A | 9/2013 |
| KR | 10-2017-0094559 A | 8/2017 |

OTHER PUBLICATIONS

Son, Youngbae, et al. "Monolithic integration of high-voltage thin-film electronics on low-voltage integrated circuits using a solution process." *Nature Electronics vol. 2. Article 11* Nov. 2019 pp. 540-548.

*Primary Examiner* — Kretelia Graham
(74) *Attorney, Agent, or Firm* — NSIP Law

(57) ABSTRACT

Provided is a static random-access memory (SRAM) device. The SRAM device includes a substrate including a PMOS area, a circuit wiring structure including an insulating layer and a wiring layer alternately stacked on the substrate, wherein the circuit wiring structure includes a first NMOS area and a second NMOS area vertically separated from the PMOS area with the first NMOS area therebetween, a first transistor including a first gate electrode disposed on the PMOS area, source/drain areas formed on the PMOS area on both sides of the first gate electrode, and a first channel connecting the source and drain areas to each other, a second transistor including a second gate electrode disposed in the first NMOS area and a second channel vertically overlapping the second gate electrode, and a third transistor including a third gate electrode disposed in the second NMOS area and a third channel vertically overlapping the third gate electrode, wherein the first channel includes silicon, wherein the second channel and the third channel include an oxide semiconductor.

6 Claims, 4 Drawing Sheets

(56) References Cited

U.S. PATENT DOCUMENTS

| | | |
|---|---|---|
| 6,808,971 B2 | 10/2004 | Bhattacharyya |
| 9,183,894 B2 | 11/2015 | Koyama |
| 9,209,251 B2 | 12/2015 | Yamazaki |
| 9,336,864 B2 * | 5/2016 | Mojumder ............ G11C 11/412 |
| 2003/0136978 A1 * | 7/2003 | Takaura ................ H10B 10/00 |
| | | 257/210 |
| 2022/0302120 A1 * | 9/2022 | Sato ....................... H10B 12/33 |

\* cited by examiner

SRAM DEVICE INCLUDING OXIDE SEMICONDUCTOR

CROSS-REFERENCE TO RELATED APPLICATIONS

This U.S. non-provisional patent application claims priority under 35 U.S.C. § 119 of Korean Patent Application No. 10-2021-0126685, filed on Sep. 24, 2021, the entire contents of which are hereby incorporated by reference.

BACKGROUND

The present disclosure herein relates to an SRAM device including an oxide semiconductor.

In order to respond to the explosive increase in data caused by cloud services and the Internet of Things (IoT), cheap, fast, and reliable memory is required, and for this, memory technologies of various concepts such as high bandwidth memory (HBM), storage class memory (SCM), and in-package memory are being developed.

In addition, the current memory has been developed and optimized for the John von Neumann computing structure, and as the demand for a new computing architecture is increasing day by day along with the improvement of computing system performance, a new memory technology capable of responding to a new environment is required.

However, with emerging memories (e.g., PCRAM, ReRAM, and MRAM) in addition to DRAM and NAND memory, in terms of performance, power consumption, and manufacturing cost, it is expected that there will be gradually limits in satisfying the new computing paradigm as well as the requirements of demand companies, and due to the limitations of scaling, it is difficult to guarantee the continuity of these technologies.

On the other hand, while the conventional 6 T static random access memory (SRAM) has a high operating speed, as a volatile memory, information may not be maintained and may be lost after power is cut off or deactivated. In addition, in relation to the conventional 6 T SRAM, since the structure of cells constituting the memory array is composed of six transistors, compared to DRAM, NAND memory, and Flash memory, the degree of integration may be relatively small.

SUMMARY

The present disclosure is to realize an SRAM device with improved integration by reducing the required layout area.

The present disclosure is also to reduce power consumption of an SRAM device by reducing leakage current, and to increase non-volatility.

An embodiment of the inventive concept provides a static random-access memory (SRAM) device including: a substrate including a PMOS area; a circuit wiring structure including an insulating layer and a wiring layer alternately stacked on the substrate, wherein the circuit wiring structure includes a first NMOS area and a second NMOS area vertically separated from the PMOS area with the first NMOS area therebetween; a first transistor including a first gate electrode disposed on the PMOS area, source/drain areas formed on the PMOS area on both sides of the first gate electrode, and a first channel connecting the source and drain areas to each other; a second transistor including a second gate electrode disposed in the first NMOS area and a second channel vertically overlapping the second gate electrode; and a third transistor including a third gate electrode disposed in the second NMOS area and a third channel vertically overlapping the third gate electrode, wherein the first channel includes silicon, wherein the second channel and the third channel include an oxide semiconductor.

In an embodiment, the oxide semiconductor may include at least one of In, Ga, Zn, Sn, K, Al, Ti, and W.

In an embodiment, the oxide semiconductor may be $InMQ_3(ZnO)_m$ (m≥0), where M includes any one or more of metal elements selected from gallium (Ga), tin (Sn), potassium (K), aluminum (Al), iron (Fe), nickel (Ni), manganese (Mn), and cobalt (Co).

In an embodiment, the first transistor may be a PMOS transistor, and the second and third transistors may be each an NMOS transistor.

In an embodiment, the SRAM device may further include: a fourth transistor including a fourth gate on the PMOS area, second source/drain areas formed on the PMOS area on both sides of the fourth gate, and a fourth channel connecting the second source/drain areas to each other; a fifth transistor including a fifth gate in the first NMOS area and a fifth channel vertically overlapping the fifth gate; and a sixth transistor including a sixth gate in the second NMOS area, and a sixth channel vertically overlapping the sixth gate, wherein the fourth channel may include silicon, wherein the fifth channel and the sixth channel may include an oxide semiconductor.

In an embodiment, the first transistor and the fourth transistor may be PMOS transistors, wherein the second transistor and the third transistor, and the fifth transistor and the sixth transistor may be NMOS transistors.

In an embodiment of the inventive concept, a static random-access memory (SRAM) device includes: a substrate; first and second transistors disposed in a first area over the substrate; a circuit wiring structure including an insulating layer and a wiring layer alternately stacked on the substrate, wherein the circuit wiring structure includes a second area and a third area vertically spaced apart from the substrate with the second area therebetween; a third transistor and a fourth transistor provided in the second area; and a fifth transistor and a sixth transistor provided in the third area, wherein two of the first to sixth transistors are one of an NMOS transistor and a PMOS transistor, and the remaining four of the first to sixth transistors are the remaining one of an NMOS transistor and a PMOS transistor, wherein two of the first to sixth transistors include a channel including any one of a silicon and an oxide semiconductor, and the remaining four of the first to sixth transistors include a channel including the other one of a silicon and an oxide semiconductor, wherein the first transistor and the second transistor are transistors of the same type, and the third transistor and the fourth transistor are transistors of the same type, and the fifth transistor and the sixth transistor are transistors of the same type.

In an embodiment, the oxide semiconductor may include at least one of In, Ga, Zn, Sn, K, Al, Ti, and W In an embodiment, the oxide semiconductor may be $InMQ_3(ZnO)_m$ (m≥0), where M includes any one or more of metal elements selected from gallium (Ga), tin (Sn), potassium (K), aluminum (Al), iron (Fe), nickel (Ni), manganese (Mn), and cobalt (Co).

In an embodiment, the first transistor and the second transistor may be PMOS transistors, wherein the third transistor, the fourth transistor, and the fifth transistor and the sixth transistor may be NMOS transistors.

In an embodiment, the first transistor and the second transistor may include a silicon channel, wherein the third transistor, the fourth transistor, the fifth transistor, and the sixth transistor may include a silicon oxide channel.

In an embodiment, the first transistor, the second transistor, the fifth transistor, and the sixth transistor may include a silicon channel, wherein the third transistor and the fourth transistor may include a silicon oxide channel.

In an embodiment of the inventive concept, a static random-access memory (SRAM) device includes: a substrate; first and second transistors disposed on the substrate; a third transistor and a fourth transistor disposed on the first and second transistors; and a fifth transistor and a sixth transistor disposed on the third and fourth transistors, wherein two of the first to sixth transistors are one of an NMOS transistor and a PMOS transistor, and the other four of the first to sixth transistors are the other one of an NMOS transistor and a PMOS transistor, wherein the two of the first to sixth transistors include a channel including any one of a silicon and an oxide semiconductor, and the remaining four of the first to sixth transistors include a channel including the other one of a silicon and an oxide semiconductor, wherein the first transistor and the second transistor are transistors of the same type, the third transistor and the fourth transistor are transistors of the same type, and the fifth transistor and the sixth transistor are transistors of the same type, wherein each channel of the first and second transistors is disposed on the same layer, each channel of the third and fourth transistors is disposed on the same layer, and each channel of the fifth and sixth transistors is disposed on the same layer.

In an embodiment, the oxide semiconductor may include at least one of In, Ga, Zn, Sn, K, Al, Ti, and W.

In an embodiment, the oxide semiconductor may be $InMQ_3(ZnO)_m$ (m≥0), where M includes any one or more of metal elements selected from gallium (Ga), tin (Sn), potassium (K), aluminum (Al), iron (Fe), nickel (Ni), manganese (Mn), and cobalt (Co).

In an embodiment, the first and third transistors may constitute a first inverter, wherein The second and fourth transistors may constitute a second inverter, wherein the first transistor may include a channel of a material different from that of the third transistor, wherein the second transistor may include a channel of a different channel material from that of the fourth transistor.

In an embodiment, the first and second transistors may be PMOS transistors, and include a silicon channel.

In an embodiment, the third to sixth transistors may include an oxide semiconductor channel.

In an embodiment, the third and fourth transistors may include an oxide semiconductor channel, wherein the fifth and sixth transistors may include a silicon channel.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

In order to fully understand the configuration and effects of the inventive concept, preferred embodiments of the inventive concept will be described in detail with reference to the accompanying drawings. The inventive concept is not limited to the embodiments disclosed below, but may be implemented in various forms, and various modifications and changes may be added. However, it is provided to completely disclose the technical idea of the inventive concept through the description of the present embodiments, and to fully inform a person of ordinary skill in the art to which the inventive concept belongs. In the accompanying drawings, the components are shown to be enlarged in size for convenience of description, and the ratio of each component may be exaggerated or reduced.

In addition, terms used in the present specification may be interpreted as meanings commonly known to those of ordinary skill in the art, unless otherwise defined. Hereinafter, the inventive concept will be described in detail by describing embodiments of the inventive concept with reference to the accompanying drawings.

Figure 1A:
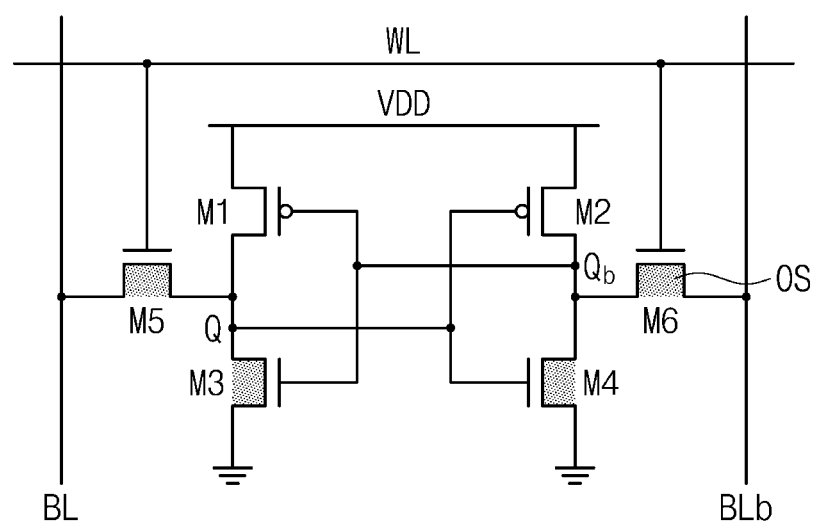
FIG. 1A is an equivalent circuit diagram of an SRAM cell according to an embodiment of the inventive concept.

FIG. 1A is an equivalent circuit diagram of a static random access memory (SRAM) cell according to an embodiment of the inventive concept. Referring to FIG. 1A, an SRAM cell according to an embodiment of the inventive concept may includes a first transistor M1, a second transistor M2, a third transistor M3, a fourth transistor M4, a fifth transistor M5, and a sixth transistor M6.

For example, the first transistor M1 and the second transistor M2 may be PMOS transistors. On the other hand, the third to sixth transistors M3 to M6 may be NMOS transistors. A power supply voltage VDD may be supplied to a first terminal of the first transistor M1, and a second terminal may be connected to the first node Q. A first terminal of the third transistor M3 may be connected to the first node Q, and a ground voltage may be supplied to the second terminal. A first terminal of the fifth transistor M5 may be connected to the bit line BL, and a second terminal may be connected to the first node Q. The gate terminal of the first transistor M1 and the gate terminal of the third transistor M3 may be electrically connected to the second node $Q_b$.

With this configuration, the first transistor M1 and the third transistor M3 may constitute a first inverter. The second node $Q_b$ may be an input terminal of the first inverter, and the first node Q may be an output terminal of the first inverter.

A power supply voltage VDD may be supplied to a first terminal of the second transistor M2, and a second terminal of the second transistor M2 may be connected to the second node $Q_b$. A first terminal of the fourth transistor M4 may be connected to the second node $Q_b$, and a ground voltage may be supplied to a second terminal of the fourth transistor M4. A first terminal of the sixth transistor M6 may be connected to the second bit line BLb, and a second terminal of the sixth transistor M6 may be connected to the second node $Q_b$. The second bit line BLb may be a complementary bit line of the first bit line BL.

The gate terminal of the first transistor M1 and the gate terminal of the third transistor M3 may be electrically connected to the second node $Q_b$. With this configuration, the first transistor M1 and the third transistor M3 may constitute a first inverter. The first node Q may be an input terminal of the second inverter, and the second node $Q_b$ may be an output terminal of the second inverter.

The combination of the first inverter and the second inverter may constitute a latch. For example, when the fifth transistor M5 and/or the sixth transistor M6 is turned on according to a signal input through the word line WL during a write operation, a signal input through the bit lines BL and/or BLb may be stored in a latch including the first inverter and the second inverter. Similarly, when the fifth transistor M5 and/or the sixth transistor M6 is turned on according to a signal input through the word line WL during a read operation, the signal stored in the latch may be output through the bit lines BL and/or BLb.

According to the concept of the inventive concept, the performance of the SRAM cell may be improved by fabricating the channel of the transistor constituting the SRAM cell using an oxide semiconductor.

Specifically, two of the first to sixth transistors M1 to M6 may be one of an NMOS transistor and a PMOS transistor, the remaining four of the first to sixth transistors M1 to M6 may be the other one of the NMOS transistor and the PMOS transistor, two of the first to sixth transistors M1 to M6 may include a channel including any one of a silicon and an oxide semiconductor, and the remaining four of the first to sixth transistors M1 to M6 may include a channel including the other one of silicon and an oxide semiconductor OS.

The first transistor M1 and the second transistor M2 are transistors of the same type (e.g., PMOS transistors), the third transistor M3 and the fourth transistor M4 are transistors of the same type (e.g., NMOS transistor), and the fifth transistor M5 and the sixth transistor M6 may be transistors of the same type (e.g., NMOS transistors).

The first inverter may include a first transistor M1 including a silicon channel and a third transistor M3 including an oxide semiconductor (OS) channel. The transistors M1 and M3 constituting the first inverter may include channels of different materials. The second inverter may include a second transistor M2 including a silicon channel and a fourth transistor M4 including an oxide semiconductor (OS) channel. The transistors M2 and M4 constituting the second inverter may include channels of different materials.

Figure 1B:
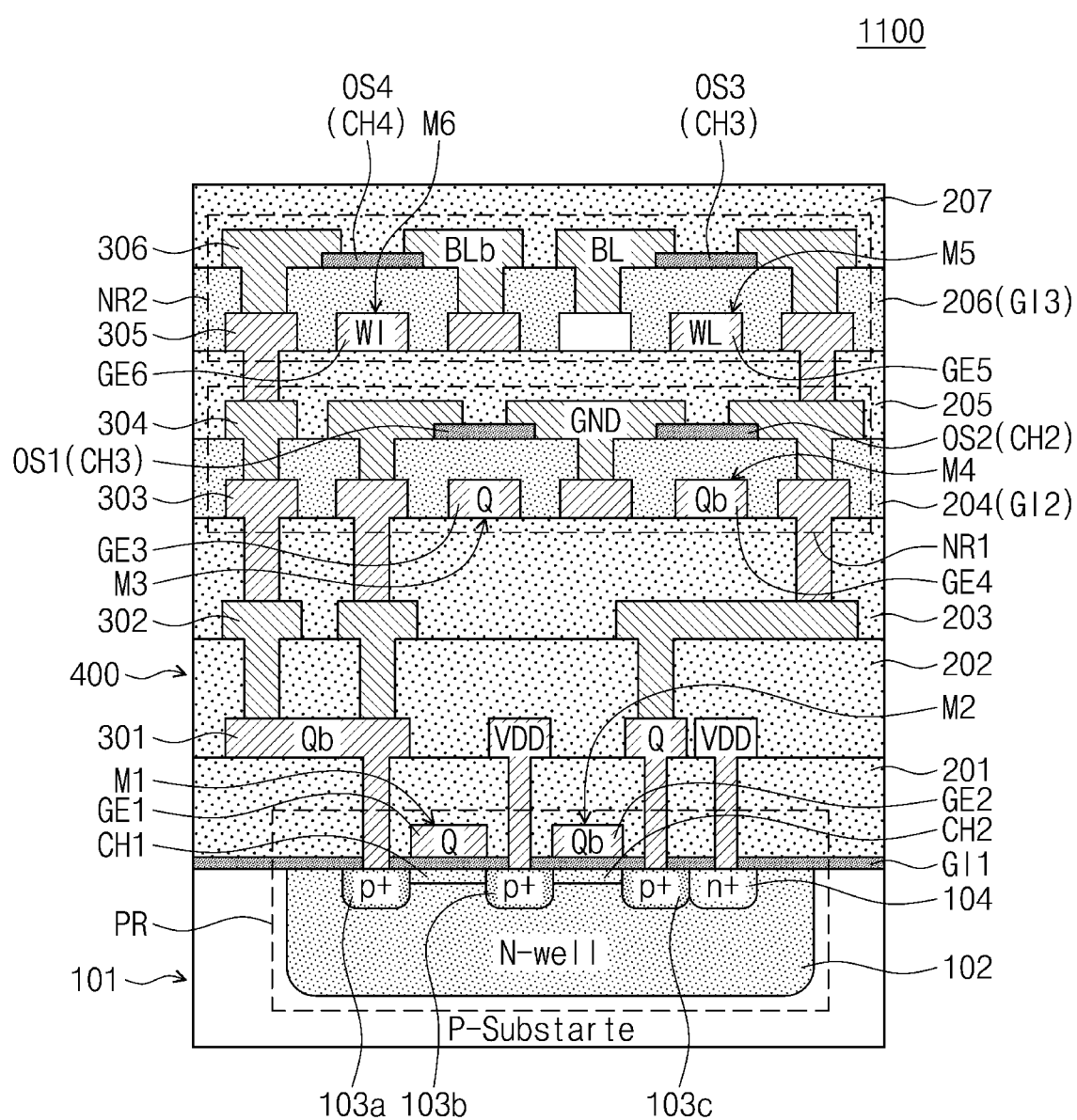
FIG. 1B is a diagram illustrating a cross-sectional view of the SRAM device of FIG. 1A.

FIG. 1B is a diagram illustrating a cross-sectional view of the SRAM device of FIG. 1A. As described in terms of circuit operation in FIG. 1A, the structure will be mainly described.

Referring to FIGS. 1A and 1B, the SRAM device 1100 may include a substrate 101 and a circuit wiring structure 400. The circuit wiring structure 400 may have a structure in which interlayer insulating layers 201, 202, 203, 204, 205, and 206 and wiring layers 301, 302, 303, 304, 305, and 306 are alternately stacked.

The substrate 101 may be a silicon substrate doped with a first conductivity type, a germanium substrate, or a silicon on insulator (SOI). For example, the first conductivity type may be a p-type. The circuit wiring structure 400 may further include a protective layer 207 on the uppermost portion. The interlayer insulating layers 201, 202, 203, 204, 205 and 206 may include a silicon oxide film, a silicon nitride film, or an insulating film including an organic material such as carbon. The wiring layers 301, 302, 303, 304, 305, and 306 may include a conductive metal.

A first transistor M1 and a second transistor M2 may be provided on the substrate 101. Third to sixth transistors M3 to M6 may be provided in the circuit wiring structure 400. The third and fourth transistors M3 and M4 may be positioned above the first and second transistors M1 and M2. The fifth and sixth transistors M5 and M6 may be positioned above the third and fourth transistors M3 and M4. That is, the first and second transistors M1 and M2, the third and fourth transistors M3 and M4, and the fifth and sixth transistors M5 and M6 may have a vertically spaced structure.

Each channel of the first and second transistors M1 and M2 is disposed on the same layer, each channel of the third and fourth transistors M3 and M4 is disposed on the same layer, and each channel of the fifth and sixth transistors M5 and M6 may be disposed on the same layer.

A first area PR may be provided on the substrate 101. The first area PR may be, for example, a PMOS area PR. The PMOS area PR may be an active area in which the first and second transistors M1 and M2 are located. A well 102 doped with the second conductivity type may be formed on the PMOS area PR. A first transistor M1 and a second transistor M2 may be positioned on the well 102.

The first transistor M1 may include a first gate GE1, first source/drain areas 103a and 103b formed on both sides of the first gate GE1, and a first channel CH1 connecting the first source/drain areas 103a and 103b.

The second transistor M2 may include a second gate GE2, second source/drain areas 103b and 103c formed on both sides of the second gate GE2, and a second channel CH2 connecting the second source/drain areas 103b and 103c.

A first gate insulating layer GI1 may be interposed between the first and second gates GE1 and GE2 and the substrate 101.

The first gate GE1 and the second gate GE2 may each include a conductive metal nitride and/or a metal. For example, the first gate GE1 and the second gate GE2 may each include a metal nitride such as TiN, WN, and TaN, and a metal such as Ti, W or Ta.

The source/drain areas 103a, 103b, and 103c of each of the first transistor M1 and the second transistor TR2 may be areas doped with the first conductivity type. The first transistor M1 and the second transistor TR2 may share a source/drain area 103b located between their gates GE1 and GE2. A doped area 104 doped with the second conductivity type may be positioned on one side of the second transistor TR2, and a power supply voltage VDD may be applied thereto.

The first gate insulating film GI1 may include at least one of a silicon oxide film, a silicon nitride film, a silicon oxynitride film, or a high dielectric film. The high-k film may have a higher dielectric constant than a silicon oxide film, such as a hafnium oxide film (HfO), a zirconium oxide film (ZrO), a hafnium zirconium oxide film (HfZrO), an aluminum oxide film (AlO), or a tantalum oxide film (TaO).

The circuit wiring structure 400 may include a second area NR1 and a third area NR2. The second area NR1 is also referred to as a first NMOS area NR1, and the third area NR2 is also referred to as a second NMOS area NR2. The first NMOS area NR1 may be located above the PMOS area PR. The second NMOS area NR2 may be positioned above the first NMOS area NR1 and may be vertically spaced apart from the PMOS area PR with the first NMOS area NR1 interposed therebetween.

The first NMOS area NR1 may be an active area in which the third transistor M3 and the fourth transistor M4 are provided. The second NMOS area NR2 may be an active area in which the fifth transistor M5 and the sixth transistor M6 are provided. The third to sixth transistors M3 to M6 will be described later.

A first interlayer insulating layer 201, a first wiring layer 301, a second interlayer insulating layer 202, a second wiring layer 302, and a third interlayer insulating layer 203 may be sequentially stacked on the first transistor M1 and the second transistor M2. Depending on the wiring design, the number of layers may be reduced or increased. The first wiring layer 301 may penetrate the first interlayer insulating layer 201, and the second wiring layer 302 may penetrate the second interlayer insulating layer 202 and be connected to the first wiring layer 301.

A fourth interlayer insulating layer 204 covering the third wiring layer 303 may be provided. The fourth interlayer insulating layer 204 may be a second gate insulating film GI2. According to some embodiments, the fourth interlayer insulating layer 204 may include the same material as the first gate insulating film GI1. A first oxide semiconductor OS1 and a second oxide semiconductor OS2 may be provided on the fourth interlayer insulating layer.

The first oxide semiconductor OS1 and the second oxide semiconductor OS2 are, for example, ZnO or $SnO_2$ based materials, and specifically, may be formed of In—Ga—Zn—O (IGZO), In—Ga—Zn—Sn—O (IGZTO), In—Ga—Sn—O (IGTO), or the like. IGZO may be formed in the form of $a(In_2O_3)$ $b(Ga_2O_3)$ $c(ZnO)$. In addition, the first oxide semiconductor OS1 and the second oxide semiconductor OS2 may further include some metal materials such as Al, W, Ti, and K. For example, the first oxide semiconductor OS1 and the second oxide semiconductor OS2 may be patterned in an island shape.

In a typical Metal Oxide Semiconductor FET (MOSFET), when the minority carrier is inverted, the channel made of the oxide semiconductor OS opens, but as in the inventive concept, in a case using a channel made of an oxide semiconductor OS, when a majority carrier is accumulated in the oxide semiconductor OS, the channel is opened, and the channel is closed when the majority carrier is in a depleted state.

The first oxide semiconductor OS1 and the second oxide semiconductor OS2 may be formed through a deposition process and a patterning process. The deposition process may be, for example, a sputtering process. The patterning process may be, for example, an etching process using a mask.

A fourth wiring layer 304 penetrating the fourth interlayer insulating layer 204 and connected to the third wiring layer 303 may be provided on the fourth interlayer insulating layer 204. The fourth wiring layer 304 may be connected to both sides of the first oxide semiconductor OS1 and both sides of the second oxide semiconductor OS2 to function as source/drain electrodes.

The third transistor M3 may include a third gate GE3, source/drain electrodes on both sides of the third gate GE3, and a third channel CH3 connecting the source/drain electrodes. The third channel CH3 may be implemented with the first oxide semiconductor OS1.

The fourth transistor M4 may include a fourth gate GE4, source/drain electrodes on both sides of the fourth gate GE4, and a fourth channel CH4 connecting the source/drain electrodes. The fourth channel CH4 may be implemented with the second oxide semiconductor OS2.

A fifth interlayer insulating layer 205 covering the fourth wiring layer 304 and the first and second oxide semiconductors OS1 and OS2 may be provided. A fifth wiring layer 305 that penetrates the fifth interlayer insulating layer 205 and is connected to the fourth wiring layer 304 may be provided. A sixth interlayer insulating layer 206 may be provided on the fifth wiring layer 305. The sixth interlayer insulating layer 206 may also function as the third gate insulating film GI3. According to some embodiments, the sixth interlayer insulating layer 206 may include the same material as the first gate insulating film GI1. A third oxide semiconductor OS3 and a fourth oxide semiconductor OS4 may be provided on the sixth interlayer insulating layer 206.

A sixth wiring layer 306 that penetrates the sixth interlayer insulating layer 206 and is connected to the fifth wiring layer 305 may be provided on the sixth interlayer insulating layer 206. The sixth wiring layer 306 may be connected to both sides of the third oxide semiconductor OS3 and both sides of the fourth oxide semiconductor OS4 to function as source/drain electrodes.

The fifth transistor M5 may include a fifth gate GE5, source/drain electrodes on both sides of the fifth gate GE5, and a fifth channel CH5 connecting the source/drain electrodes. The fifth channel CH5 may be implemented as a third oxide semiconductor OS3.

The sixth transistor M6 may include a sixth gate GE6, source/drain electrodes on both sides of the sixth gate GE6, and a sixth channel CH6 connecting the source/drain electrodes. The sixth channel CH6 may be implemented as a fourth oxide semiconductor OS4.

A protective layer 207 covering the sixth wiring layer 306 and the third and fourth oxide semiconductors OS3 and OS4 may be provided.

A semiconductor chip is formed including various types of semiconductor circuit elements, and among them, a large number of CMOS inverter elements are formed. These CMOS inverter devices are generally formed across the surface of a silicon substrate in a horizontal direction.

In particular, the layout area may be increased by the area of the N-well and the area of the P-well on the silicon substrate. In the case of using a plurality of logic elements, the N-well and the P-well are formed on the same layer, resulting in a large layout area.

However, the CMOS inverter device formed in the horizontal direction requires a large layout area, and the connection line of the signals is long, resulting in a delay in signal transmission. Accordingly, the size of the semiconductor chip also increases, which causes difficulties in developing high-speed circuits. Therefore, it is required to develop a CMOS inverter device capable of reducing the required layout area and shortening the connection length between circuits as much as possible to enable high-speed operation.

As described above, in the inventive concept, silicon-based transistors M1 and M2 are first made, and then the oxide semiconductor-based transistors M3, M4, M5, and M6 are stacked in a stack such that the PMOS area PR, the first NMOS area NR1, and the second NMOS area NR2 are vertically stacked. In the PMOS area PR, the first NMOS area NR1, and the second NMOS area NR2, wiring layers are arranged at different levels, such that by passing the signal and voltage as shown in FIG. 1A, the SRAM circuit operates.

According to the inventive concept, as having the shape of a vertical SRAM, it may be possible to make an SRAM smaller than the circuit area (layout area) of a silicon transistor-based SRAM made on a single substrate. In addition, as using an oxide semiconductor, circuit power consumption may be significantly reduced compared to Si CMOS using the very low leakage current of less than $10^{-15}$ A/um of oxide semiconductor.

Figure 2A:
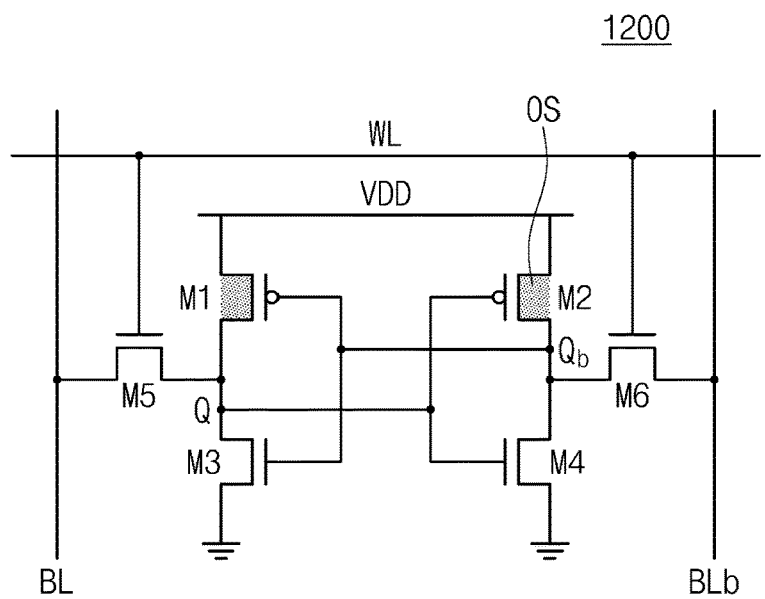
FIGS. 2A, 2B, and 2C respectively illustrate circuit diagrams of an SRAM device according to some embodiments.
Figure 2B:
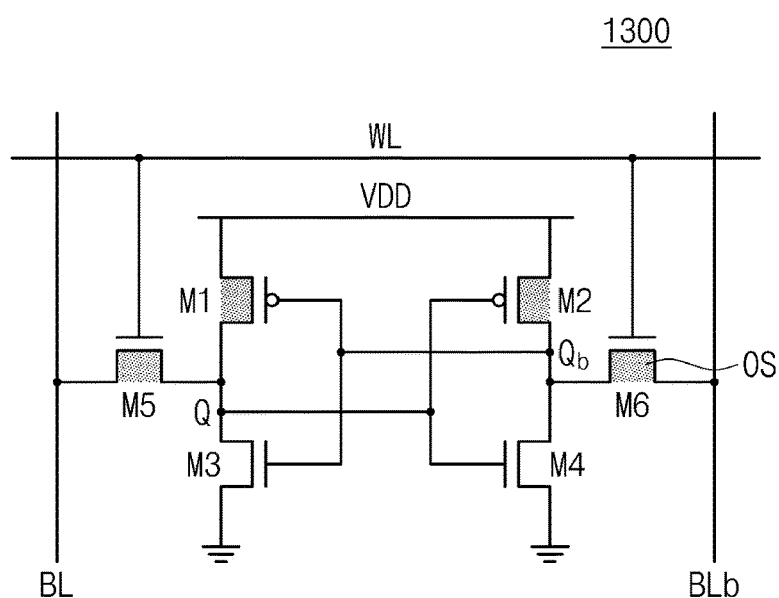
Figure 2C:
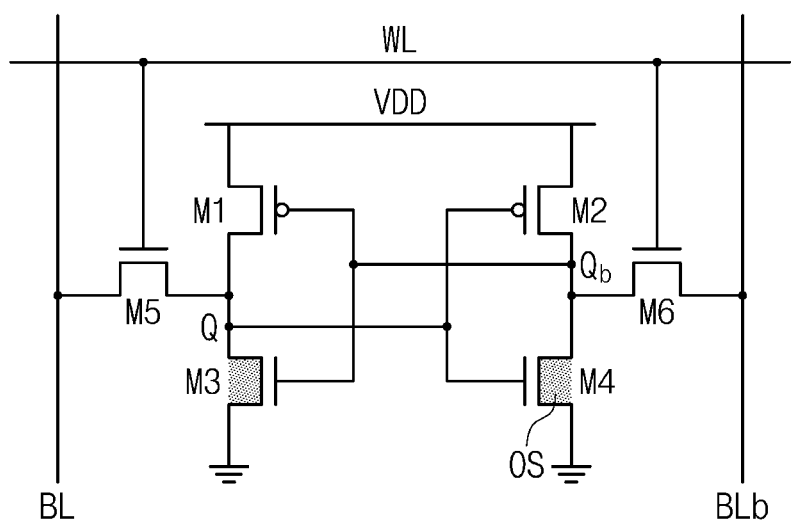

FIGS. 2A, 2B, and 2C illustrate circuit diagrams of an SRAM device according to some embodiments, respectively. Except for those described below, since they overlap with those described in FIG. 1A, they will be omitted.

Referring to FIG. 2A, an SRAM device 1200 according to some embodiments may include a first transistor M1 including an oxide semiconductor OS as a channel, a second transistor M2, a third transistor M3 including silicon as a channel, a fourth transistor M4, a fifth transistor M5, and a sixth transistor M6. The first inverter may include a first transistor M1 including an oxide semiconductor OS and a third transistor M3 including silicon as a channel. The second inverter may include a second transistor M2 including an oxide semiconductor OS as a channel and a fourth transistor M4 including silicon as a channel.

When the circuit diagram as shown in FIG. 2A is implemented as a cross-sectional view as in FIG. 1B, it may be advantageous in terms of processing that the third and fourth transistors M3 and M4 are disposed on the substrate, or that the fifth and sixth transistors M5 and M6 are disposed on the substrate. That is, it may be advantageous in terms of processes that the silicon channel is formed on the same layer as the substrate and the oxide semiconductor is formed through a deposition process.

For example, a first NMOS area (where M3 and M4 are disposed) is disposed on a substrate, and a PMOS area (where M1 and M2 are disposed) and a second NMOS area (where M5 and M6 are disposed) may be disposed in the circuit wiring structure 400.

Referring to FIG. 2B, the SRAM device 1300 according to some embodiments may be connected to a complementary word line WLb. The first, second, fifth, and sixth transistors M1, M2, M5, and M6 may be PMOS transistors. On the other hand, the third and fourth transistors M3 and M4 may be NMOS transistors.

The SRAM device 1300 may include an NMOS area, a first PMOS area, and a second PMOS area. Third and fourth transistors M3 and M4 may be disposed in the NMOS area. First and second transistors M1 and M2 may be disposed in the first PMOS area. Third and fourth transistors M5 and M7 may be disposed in the second PMOS area.

The first, second, fifth, and sixth transistors M1, M2, M5, and M6 may include an oxide semiconductor as a channel. The third and fourth transistors M3 and M4 may include silicon as a channel.

When the circuit diagram as shown in FIG. 2B is implemented as a cross-sectional view as in FIG. 1B, it may be advantageous for the third and fourth transistors M3 and M4 to be disposed on a silicon substrate.

In this case, the NMOS area (where M3 and M4 are arranged) may be arranged on the substrate, and a first PMOS area (where M1 and M2 are arranged) and a second PMOS area (where M5 and M6 are arranged) may be arranged in the circuit wiring structure 400.

In FIG. 2C, as in FIG. 2B, the SRAM device 1400 may be connected to the complementary word line WLb. The first, second, fifth, and sixth transistors M1, M2, M5, and M6 may be PMOS transistors. On the other hand, the third and fourth transistors M3 and M4 may be NMOS transistors.

The third and fourth transistors M3 and M4 may include an oxide semiconductor as a channel. The first, second, fifth, and sixth transistors M1, M2, M5, and M6 may include silicon as a channel.

When the circuit diagram as shown in FIG. 2C is implemented as a cross-sectional view as in FIG. 1B, it may be advantageous in terms of processing that the first and second transistors M1 and M2 are disposed on the substrate, or the fifth and sixth transistors M5 and M6 are disposed on the substrate. For example, a first PMOS area (where M1 and M2 are disposed) may be disposed on a substrate, and a second PMOS area (where M5 and M6 are disposed) and an NMOS area (where M3 and M4 are disposed) may be disposed in the circuit wiring structure 400.

By implementing the vertical SRAM device, the required layout area may be reduced. At least some of the transistors constituting the SRAM device include an oxide semiconductor, thereby reducing leakage current to reduce power consumption of the SRAM device.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:

1. A static random-access memory (SRAM) device comprising:
    a substrate including a PMOS area;
    a circuit wiring structure including an insulating layer and a wiring layer alternately stacked on the substrate, wherein the circuit wiring structure comprises a first NMOS area and a second NMOS area vertically separated from the PMOS area with the first NMOS area therebetween;
    a first transistor including a first gate electrode disposed on the PMOS area, source/drain areas formed on the PMOS area on both sides of the first gate electrode, and a first channel connecting the source and drain areas to each other;
    a second transistor including a second gate electrode disposed in the first NMOS area and a second channel vertically overlapping the second gate electrode; and
    a third transistor including a third gate electrode disposed in the second NMOS area and a third channel vertically overlapping the third gate electrode,
    wherein the first channel comprises silicon,
    wherein the second channel and the third channel comprise an oxide semiconductor.

2. The SRAM device of claim 1, wherein the oxide semiconductor comprises at least one of In, Ga, Zn, Sn, K, Al, Ti, and W.

3. The SRAM device of claim 1, wherein the oxide semiconductor is $InMO_3(ZnO)_m$ (m≥0),
    where M comprises any one or more of metal elements selected from gallium (Ga), tin (Sn), potassium (K), aluminum (Al), iron (Fe), nickel (Ni), manganese (Mn), and cobalt (Co).

4. The SRAM device of claim 1, wherein the first transistor is a PMOS transistor, and the second and third transistors are each an NMOS transistor.

5. The SRAM device of claim 1, further comprising:
    a fourth transistor including a fourth gate on the PMOS area, second source/drain areas formed on the PMOS area on both sides of the fourth gate, and a fourth channel connecting the second source/drain areas to each other;
    a fifth transistor including a fifth gate in the first NMOS area and a fifth channel vertically overlapping the fifth gate; and
    a sixth transistor including a sixth gate in the second NMOS area, and a sixth channel vertically overlapping the sixth gate,
    wherein the fourth channel comprises silicon,
    wherein the fifth channel and the sixth channel comprise an oxide semiconductor.

6. The SRAM device of claim 5, wherein the first transistor and the fourth transistor are PMOS transistors,
    wherein the second transistor and the third transistor, and the fifth transistor and the sixth transistor are NMOS transistors.

* * * * *